US008803112B2

(12) United States Patent (10) Patent No.: US 8,803,112 B2
Sinha et al. (45) Date of Patent: Aug. 12, 2014

(54) SILICON-CONTAINING DOPANT COMPOSITIONS, SYSTEMS AND METHODS OF USE THEREOF FOR IMPROVING ION BEAM CURRENT AND PERFORMANCE DURING SILICON ION IMPLANTATION

(71) Applicants: Ashwini K. Sinha, East Amherst, NY (US); Lloyd Anthony Brown, East Amherst, NY (US); Serge Marius Campeau, Lancaster, NY (US)

(72) Inventors: Ashwini K. Sinha, East Amherst, NY (US); Lloyd Anthony Brown, East Amherst, NY (US); Serge Marius Campeau, Lancaster, NY (US)

(73) Assignee: Praxair Technology, Inc., Danbury, CT (US)

( * ) Notice: Subject to any disclaimer, the term of this patent is extended or adjusted under 35 U.S.C. 154(b) by 0 days.

(21) Appl. No.: 14/011,887

(22) Filed: Aug. 28, 2013

(65) Prior Publication Data
US 2014/0061501 A1  Mar. 6, 2014

Related U.S. Application Data

(60) Provisional application No. 61/693,916, filed on Aug. 28, 2012.

(51) Int. Cl.
*H01J 37/08* (2006.01)
*H01J 37/317* (2006.01)
(52) U.S. Cl.
CPC .............. *H01J 37/08* (2013.01); *H01J 37/3171* (2013.01); *H01J 2237/006* (2013.01)
USPC ....................... 250/492.3; 250/492.2; 250/424

(58) Field of Classification Search
CPC .............. A61N 5/00; G21G 5/00; H01J 37/08
USPC ........................................................ 250/492.3
See application file for complete search history.

(56) References Cited

U.S. PATENT DOCUMENTS

| 5,656,820 A | 8/1997 | Murakoshi et al. |
| 5,940,724 A | 8/1999 | Warren |
| 5,943,594 A | 8/1999 | Bailey et al. |
| 6,215,125 B1 | 4/2001 | Chen et al. |

(Continued)

FOREIGN PATENT DOCUMENTS

| EP | 0204396 A1 | 12/1986 |
| WO | WO 03/044837 A2 | 5/2003 |
| WO | WO2012037007 A2 | 3/2012 |

OTHER PUBLICATIONS

Prascher, Brian P. et al. "A CCSD(T) and ccCA Study of Mixed Silicon Hydrides and Halides: Structures and Thermochemistry". Chemical Physics 359 (2009), pp. 1-13.

*Primary Examiner* — Phillip A Johnston
(74) *Attorney, Agent, or Firm* — Nilay S. Dalal

(57) ABSTRACT

A novel composition, system and method thereof for improving beam current during silicon ion implantation are provided. The silicon ion implant process involves utilizing a first silicon-based co-species and a second species. The second species is selected to have an ionization cross-section higher than that of the first silicon-based species at an operating arc voltage of an ion source utilized during generation and implantation of active silicon ions species. The active silicon ions produce an improved beam current characterized by maintaining or increasing the beam current level without incurring degradation of the ion source when compared to a beam current generated solely from SiF4.

20 Claims, 4 Drawing Sheets

Schematic of an ion source apparatus

(56) References Cited

U.S. PATENT DOCUMENTS

| | | |
|---|---|---|
| 6,559,462 B1 | 5/2003 | Carpenter et al. |
| 6,756,600 B2 | 6/2004 | Ng et al. |
| 7,586,109 B2 * | 9/2009 | Perel et al. ............... 250/492.21 |
| 7,655,931 B2 | 2/2010 | Gupta |
| 8,062,965 B2 * | 11/2011 | Kaim et al. ................ 438/513 |
| 8,237,134 B2 * | 8/2012 | Kaim et al. .............. 250/492.21 |
| 8,399,865 B2 * | 3/2013 | Kaim et al. .............. 250/492.21 |
| 2012/0235058 A1 * | 9/2012 | Sinha et al. ................ 250/424 |

\* cited by examiner

Schematic of an ion source apparatus

Si+ beam current (normalized) for different dopant gas source composition. A-SiF$_4$; B-SiF$_4$+20% Xe+H$_2$; C-SiF$_4$+50% SiH$_4$; D-5%Si$_2$H$_6$+SiF$_4$; E-2.5%Si$_2$H$_6$+SiF$_4$; F-50%Si$_2$H$_6$+SiF$_4$; G-80%Si$_2$H$_6$+SiF$_4$ Ionization cross-section of different Si containing species Arc chamber deposits after operation with different dopant composition, (A) 80%$Si_2H_6$/$Si_4$–20 hrs; (B) 50%$Si_2H_6$/$SiF_4$–20 hrs; (C) 2.5% $Si_2H_6$/$SiF_4$–60 hrs

SILICON-CONTAINING DOPANT COMPOSITIONS, SYSTEMS AND METHODS OF USE THEREOF FOR IMPROVING ION BEAM CURRENT AND PERFORMANCE DURING SILICON ION IMPLANTATION

RELATED APPLICATIONS

This application claims the benefit of priority to U.S. provisional application Ser. No. 61/693,916, filed on Aug. 28, 2012, the disclosure of which is incorporated by reference herein in its entirety.

FIELD OF INVENTION

The present invention relates to a unique combination of silicon-containing dopant compositions, systems and methods of use thereof for improved silicon ion implant processes, and particularly an improved beam current.

BACKGROUND OF THE INVENTION

Ion implantation is an important process in semiconductor/microelectronic manufacturing. The ion implantation process is used in integrated circuit fabrication to introduce dopant impurities into semiconductor wafers. The desired dopant impurities are introduced into semiconductor wafers to form doped regions at a desired depth. The dopant impurities are selected to bond with the semiconductor wafer material to create electrical carriers and thereby alter the electrical conductivity of the semiconductor wafer material. The concentration of dopant impurities introduced determines the electrical conductivity of the doped region. Many impurity regions are necessarily created to form transistor structures, isolation structures and other electronic structures, which collectively function as a semiconductor device.

The dopant impurities are generally ions derived from a source dopant gas. An ion-source filament is used to ionize the dopant gas source into the various dopant ionic species. The ions produce a plasma environment within the ion chamber. The ions are subsequently extracted from the ion chamber in the form of a defined ion beam. The resultant ion beam is typically characterized by a beam current. Generally speaking, a higher beam current can allow more dopant ionic species to be available for implantation into a given workpeice, such as a wafer. In this manner, a higher implant dosage of the dopant ionic species can be achieved for a given flow rate of source dopant gas. The resultant ion beam may be transported through a mass analyzer/filter and then transported to the surface of a workpiece, such as a semiconductor wafer. The desired dopant ionic species of the beam penetrate the surface of the semiconductor wafer to form a doped region of a certain depth with desired electrical and/or physical properties.

Silicon implantation has been widely used in the semiconductor industry for a variety of material modification applications such as amorphization or photoresist modification. The increasing use of Si implant steps during device fabrication is requiring a need for an improved process for implantation of various Si ionic dopant species characterized by an increased beam current without compromising ion source life. The higher beam current may allow higher equipment throughput and significant productivity improvements. It should be understood that the terms "Si ions", "Si ionic species", "Si ionic dopant species" and "Si+ ions" will be used interchangeably throughout the specification.

Silicon tetrafluoride (SiF4) has been utilized as a dopant gas source for silicon ion implantation. However, SiF4 has various drawbacks. Of particular significance, SiF4 may be limited in its ability to ionize and generate the requisite amount of Si+ ions to establish the higher beam current being demanded by today's applications. Increasing the amount of Si+ ions that are generated from SiF4 typically requires increasing the energy inputted to the ion source, otherwise referred to in the industry as the operating arc voltage of the ion source. However, operating at increased energy levels can damage the ion source components, which may ultimately reduce the ability of the ion source to generate Si+ ions during operation. For example, as the walls of the arc chamber increase in temperature during a typical ion implant process, active fluorine that is released from SiF4 can more rapidly etch and erode the tungsten chamber walls, which can cause the cathode to be more susceptible to increased deposition of W-containing deposits. The W-containing deposits suppress the ion source's ability to generate the threshold number of electrons necessary to sustain the plasma and generate Si+ ions. Additionally, more active fluorine ions are available to propagate the so-called detrimental "halogen cycle" by which increased chemical erosion of the ion source chamber wall and other chamber components can occur. Accordingly, operating the ion source chamber at higher energy levels in an attempt to increase ionization of SiF4 has the potential for shorter ion-source life, thereby rendering this mode of operation undesirable.

Currently, there are no viable techniques for maintaining or increasing the beam current of Si+ ion without damaging the ion source chamber components. There remains an unmet need to develop compositions, systems and methods of use thereof to improve the beam current of the desired silicon ion species without compromising the ion source life.

SUMMARY OF THE INVENTION

The invention relates, in part, to a composition, system and method of use thereof for improving beam current improving silicon ion source performance. The composition of the dopant gas utilized has been found to have a significant impact on the ability to improve beam current.

In a first aspect, a dopant gas composition is provided comprising a silicon-based dopant gas composition. The composition comprises a first silicon-based species and a second species. The second species is selected to have an ionization cross-section higher than that of the first silicon-based species at an operating arc voltage of an ion source utilized during generation and implantation of active silicon ions. The silicon-based dopant gas composition improves the ion beam current so as to maintain or increase beam current without degradation of said ion source in comparison to a beam current generated from silicon tetrafluoride (SiF4).

In a second aspect, a system for providing an improved beam current during silicon ion implantation is provided. The system comprises an ion source apparatus partially defined by an arc chamber wall, wherein the chamber comprises a silicon ion source disposed at least partially within the chamber wall. One or more supply vessels are provided in fluid communication with said ion source apparatus. The one or more supply vessels store silicon-based dopant gas composition. The composition comprises a first silicon-based species and a second species, wherein said second species is selected to have an ionization cross-section higher than that of the first silicon-based species at an operating arc voltage of the ion source during implantation of active silicon ions. One or more supply feed lines corresponding to the one or more supply vessels. The one or more feed lines extend from the one or more supply vessels through the wall into the chamber. The one or more supply vessels are configured to dispense the silicon-based dopant composition through the one or more supply feed lines and into said ion source apparatus, thereby allowing the silicon ion source to ionize the silicon-based dopant gas composition to generate at least a portion of the active silicon ions from at least said first silicon-based species. The active silicon ions produce an increased beam current in comparison to a beam current generated solely from SiF4.

In a third aspect, a method for increasing beam current during silicon ion implantation is provided. The method comprises selecting a first silicon-based species and selecting a second species having an ionization cross-section higher than that of the first silicon-based species at a predetermined operating arc voltage of an ion source to be utilized during generation and implantation of active silicon ions. The first silicon-based and the second species are provided in one or more supply vessels. The first silicon-based species and the second species are flowed from the one or more of the supply vessels into an ion source apparatus. The first silicon-based species ionizes. Active silicon ions are generated. An increased beam current is produced in comparison to a beam current generated solely from SiF4, wherein said increased beam current extends source life in comparison to a beam current generated solely from SiF4.

BRIEF DESCRIPTION OF THE DRAWINGS

The objectives and advantages of the invention will be better understood from the following detailed description of the preferred embodiments thereof in connection with the accompanying figures wherein like numbers denote same features throughout and wherein.

DETAILED DESCRIPTION OF THE INVENTION

Figure 1:
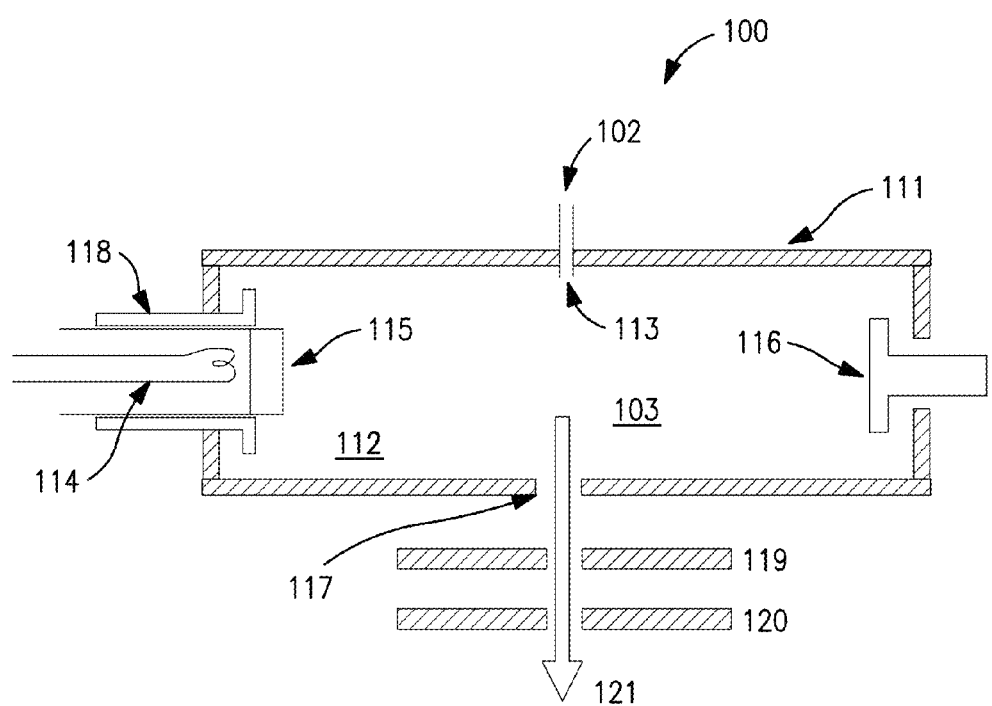
FIG. 1 shows an ion implanter incorporating the principles of the invention.

The relationship and functioning of the various elements of this invention are better understood by the following detailed description. The detailed description contemplates the features, aspects and embodiments in various permutations and combinations, as being within the scope of the disclosure. The disclosure may therefore be specified as comprising, consisting or consisting essentially of, any of such combinations and permutations of these specific features, aspects, and embodiments, or a selected one or ones thereof.

"Si ions" as used herein and throughout the specification means various silicon ion dopant species, including silicon or silicon containing positive ions suitable for implantation into a substrate.

As used herein, unless indicated otherwise, all concentrations are expressed as volumetric percentages ("vol %").

The present disclosure in one aspect relates to novel silicon-containing dopant compositions, systems, and methods of use thereof for increasing the Si beam current in comparison to conventional silicon dopant sources. The term "silicon-based dopant gas composition" of the present invention as used herein and throughout the specification is intended to refer to a first silicon based species and a second species selected such that the second species has a higher ionization cross-section than the first silicon based species at the selected ion implant operating conditions (e.g., arc voltage or energy input to the ion source) as will be described herein. "Ionization cross-section" is defined as the probability (measured in units of area) that ionization will occur when an atom or molecule undergoes collision with an electron emitted from the ion source. The second species is a complimentary gas which allows the ion source to operate at a condition that helps maintain its efficiency for a longer duration compared to utilizing only SiF4 in an ion implant process for silicon implantation. The silicon-based dopant gas composition of the present invention as will be described herein improves the performance of ion-source in comparison to previous silicon dopant source materials without compromising ion source life. "Ion source performance" takes into consideration key performance metrics that include stability of beam current, source life and the extent of beam glitching. "Beam glitching" as used herein refers to the voltage discharge that can result in momentary drops in the beam current. The disclosure is set out herein in various embodiments and with reference to various aspects and features of the invention.

A unique silicon-based dopant gas composition enables increased beam current relative to other conventional source dopant gases typically utilized in silicon ion implantation without compromising ion source life. Numerous combinations of a first silicon-based species and a second species may be used. For example, the first silicon-based species may include Si2H6 and the second species may include Xe or other inert gases. In other representative examples, SiH4 may be used with a second species including Xe or other inerts. Alternatively, SiH2Cl2 or SiF2H2 may be used with a second species including various diluents such as Xe and/or Kr. In each of the examples, the second species must be chosen so as to have a higher ionization cross-section than the first silicon-based species along a preferred range of arc voltages (i.e., energy input to the ion source) at which the ion source operates so as to maintain or increase beam current without degrading the ion source during operation of the ion source.

In a preferred embodiment, the first silicon based species comprises SiF4, contained in a predetermined concentration at the inlet and/or within ion source apparatus 100. In accordance with the principles of the present invention, the SiF4 may be utilized in combination with a second gas species that includes any suitable inert gas or diluent gas, a second silicon-based co-species or a combination thereof. For example, the diluent gas may include xenon or krypton either of which is used in the ion implantation process at a higher ionization cross-section than SiF4 at the selected operating energy level inputted into the ion source. Other suitable diluent or inert gases may be utilized, including Ne, He, Ar or N2, hydrogen containing gases, or any combination thereof.

In a preferred embodiment, the first gas species is SiF4 and the second gas species includes a second silicon-based co-species which is added to the SiF4 in a predetermined amount. It has been shown that adding the second silicon-based co-species in a predetermined concentration at operating conditions of the ion source process that causes the second Si-based co-species to have an ionization cross-section that is higher than the SiF4 ionization cross-section tends to increase the Si+ beam current without requiring the need to make any additional changes in the operating parameters. Furthermore, it has been found that at certain preferred compositions of the silicon-containing gas mixture, it is possible to operate the ion source at a lower arc voltage and further reduce ion source component degradation during its operation.

Preferably, the second silicon-based co-species comprises disilane (Si2H6). The combination of co-species Si2H6 and SiF4 in a specific ratio can provide the source of silicon ions available for implantation into a given substrate. In one embodiment, the Si2H6 co-species is contained at about 1-10 vol % based on the volume of the overall silicon-based dopant gas composition. In another embodiment, the Si2H6 co-species is contained at about 2-7 vol %. As will be discussed, the present invention has discovered that a specific compositional range of Si2H6 relative to SiF4 under selected ionization conditions of the dopant gas mixture and operating conditions of the ion chamber enables an improvement in beam current whereby the beam current can be increased without degradation of the ion source. In this manner, an increased silicon ion beam current is possible without an accumulation of deposits to an unacceptable level that causes shortening of the source life. Si2H6 serves as a complimentary gas when in the preferred concentration that can allow the ion source to operate at a condition that helps maintain its efficiency for a longer duration compared to an ion implant process utilizing only SiF4, as will be demonstrated in the Examples below.

Furthermore, it has been shown that adding a predetermined amount of a second Si-based species whose ionization cross-section is higher than the SiF4 ionization cross-section in a preferred or optimal operating condition for SiF4 can increase the generated Si+ beam current without any need to make additional changes to the operating parameters of the ion implantation when utilizing solely SiF4. For example, the present invention can produce an improved beam current (i.e., sustained or increased beam current generated without shortened ion source life) without requiring the need for additional energy to be inputted into the ion source when utilizing a preferred concentration range of a mixture of SiF4 and Si2H6. In other words, the Si2H6 is added to the SiF4 in an amount that does not exceed an upper limit so as to increase beam current and throughput relative to that of a beam current generated solely from SiF4.

Furthermore, it has been found that at certain compositions of the Si gas mixtures contemplated by the present invention, the ion source can be operated at a lower arc voltage without a significant reduction in beam current and which can advantageously further reduce ion source component degradation during ion implant operation.

In a preferred embodiment and as will be explained in the Examples below, Si ions are implanted from a Si-containing mixture that includes Si2H6 and SiF4 in a predetermined concentration range. Any suitable ion implantation apparatus may be utilized with the Si2H6 and SiF4 mixture. With reference to FIG. 1, a representative ion implantation apparatus 100 is shown for implanting Si ions derived from Si2H6 and SiF4. The ion source apparatus 100 depicted in FIG. 1 has various components, including an indirectly heated cathode (IHC) 115 which may serve as the ion source for ionizing the silicon-based dopant gas composition of the present invention into its corresponding silicon active ions. It should be understood that the silicon-based dopant gas composition is suitable with other types of ion sources known in the art, including, for example, the Freeman sources, Bernas sources and RF plasma sources.

The ion source apparatus 100 of FIG. 1 can be used for producing an electron beam for implanting silicon active ions into a semiconductor substrate. The silicon active ions are generated from ionization of the SiF4 and Si2H6 in a manner that generates higher Si+ beam current in comparison to a beam current generated solely from SiF4. Without being bound by any particular theory, it is believed that under a specific compositional range of SiF4 with Si2H6 and carefully selected operating conditions of the ion source apparatus 100, the SiF4 and Si2H6 interact with one another in a synergistic manner to create an ionization mechanism that generates an increased amount of Si+ active ions to produce an increased and improved beam current.

Figure 4:
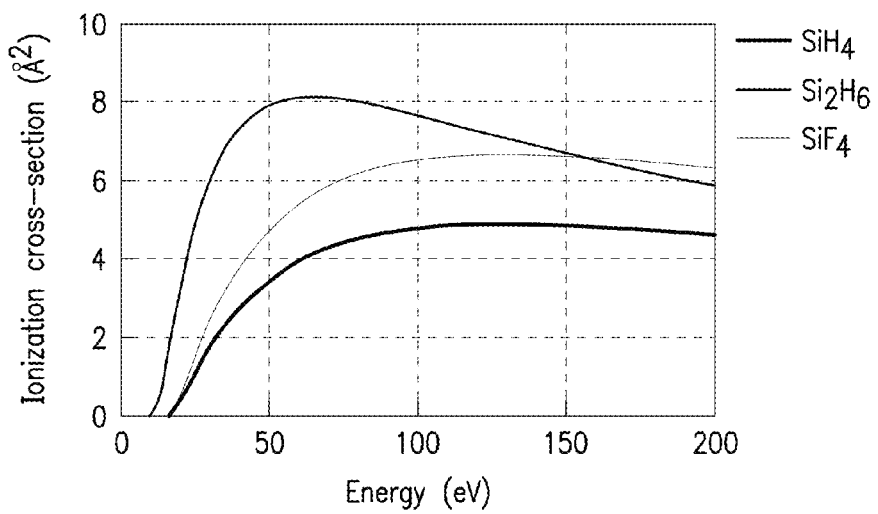
FIG. 4 plots the ionization cross-section for different Si containing gases at different energy levels.

FIG. 4 plots the ionization cross-section for different silicon compounds as a function of energy. Si2H6 exhibits a higher ionization cross-section than SiF4 at the preferred operating energy levels or arc voltages of the ion source at which SiF4 ionization can occur. In other words, FIG. 4 shows that Si2H6 has a higher probability of generating ions under such arc voltage operating conditions of the ion source. The presence of ions produced from Si2H6 augments the ionization process of SiF4 resulting in higher Si+ beam current. On the contrary, FIG. 4 shows that SiH4 has a smaller ionization cross-section than SiF4, thus reducing the net probability for SiF4 to interact and collide with ionized species of SiH4 and ionize into ionized SiF4 species, thereby resulting in a drop of Si+ beam current.

Referring to FIG. 4, Si2H6 exhibits a higher ionization cross-section than SiF4 at the selected operating arc voltages of about 80V-120V under which SiF4 ionization occurs. Within this selected operating regime, Si2H6 has a higher probability of generating various silicon-containing ions. The presence of the silicon-containing ions derived from Si2H6 augments the ionization process of SiF4 resulting in higher Si+ beam current without degradation of the source filament of the ion source. However, it has been discovered that the improvement in beam current is only exhibited within a certain concentration range for Si2H6 that is less than about 50%, and preferably less than about 40%, and more preferably less than 20% and most preferably less than 10%.

Figure 3:
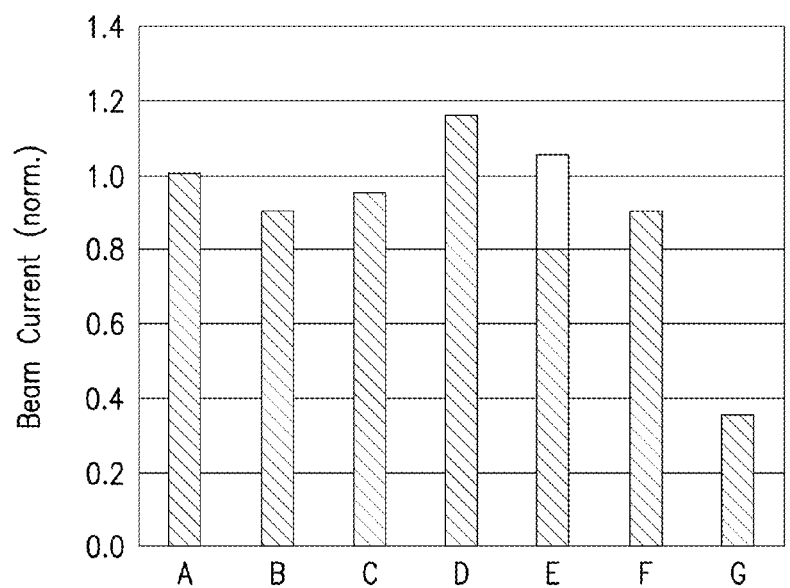
FIG. 3 is a comparison of beam current levels of the silicon-based dopant gas composition of the present invention with other types of silicon-based dopant gas materials.

As will be shown in the Examples below in connection with FIG. 3, elevated Si2H6 concentrations of about 50% or higher of the total gas mix caused a reduction in beam current in comparison to a beam current produced from undiluted (i.e., pure) SiF4. Moreover, the beam current drops significantly at 80% Si2H6 and 20% SiF4. Under such conditions of elevated Si2H6 concentrations of about 50% or greater, the plasma was observed to exhibit poor extraction of the silicon ions from the arc chamber, which resulted in lower beam current. FIG. 3 shows Si+ beam current obtained while ionizing different Si-containing gas mixes. A Si2H6 containing gas mix (5% Si2H6 balance SiF4) showed about a 20% increase in Si+ beam current compared to undiluted SiF4. Furthermore, FIG. 3 shows that the addition of other Si-containing complimentary species to SiF4 resulted in a drop of beam current. For example, as will be discussed below in the Examples, a 50% SiF4 and 50% SiH4 gas mix exhibited about a 5% drop in the beam current compared to a beam current generated from undiluted SiF4 case.

Additionally, Si containing deposits were observed at these elevated dilsilane concentrations at 50% and higher, thereby resulting in lower beam current during the course of operation and premature failure of the ion-source.

As a result of maintaining the Si2H6 below a predetermined upper limit, it has been shown that the addition of a second Si-based co-species in an amount less than SiF4 and whose ionization cross-section is higher than the SiF4 ionization cross-section at the preferred or optimal operating condition for SiF4 can increase the Si+ beam current obtained without any additional changes in the operating parameters, such as increased arc voltage. On the contrary, the present invention has surprisingly found that at certain compositions of Si2H6 and SiF4, the ion source can actually be operated at a lower arc voltage that is capable of maintaining substantially the same beam current while prolonging source life (i.e., ion source component degradation as a result of cathode thinning and/or fluorine attack is avoided). The ability to operate at a reduced arc voltage and still maintain substantially the same beam current is possible as a result of the corresponding ionization cross-sectional curves of Si2H6 and SiF4 shown in FIG. 4. For example, a reduction in arc voltage from about 110 V to about 80 V can occur due to the increasing difference between the ionization cross-sectional curves of Si2H6 and the SiF4 at the lower arc voltages, as shown in FIG. 4. A larger difference in ionization cross-sectional difference between Si2H6 and SiF4 is seen to occur at relatively lower arc voltages, which can allow a higher likelihood that a sufficient number of Si active ions will be generated to offset any tendency for a decrease in overall beam current due to less arc voltage. In other words, although the lower arc voltage may potentially result in a lower amount of Si total ions that are generated, the increased ionization cross-sectional difference enables sufficient ionization to maintain beam current while significantly reducing fluorine attack and cathode thinning, thereby extending ion source life and ultimately improving throughput. Selection of an optimal operating voltage (i.e., energy input to the ion source) is a function of the gas species and their corresponding ionization cross-sectional curves. The optimal arc voltage will allow maintenance or increase of beam current without degradation of the ion source. In one embodiment, optimal voltage occurs in a range between 85-95 V.

Additionally the dopant gas composition disclosed in this invention preferably allows the ion source cathode 115 life to be extended compared to conventional silicon dopant ion implantation systems, at least in part, on the basis of minimal rate of weight change of the source cathode 115 during the operation of the ion source apparatus 100. The net result is an ion source cathode 115 that is not subject to premature failure, thereby allowing the source cathode 115 to remain operational for an extended period of time to increase throughput. In this manner, the present invention possesses a unique silicon-based dopant gas composition capable of maintaining or increasing silicon ion beam current relative to a beam current generated solely from SiF4 while simultaneously maintaining the integrity of the source filament 115 for a longer duration than previously possible utilizing conventional silicon precursor materials such as SiF4.

Still referring to the ion source apparatus 100 of FIG. 1, a silicon dopant gas composition stream 102 comprising SiF4 and Si2H6 in a predetermined ratio is introduced into an ion source chamber 112 through a gas feed line extending through arc chamber wall 111. In one embodiment, the Si2H6 is maintained below 50% based on the overall composition stream 102. In another embodiment, the Si2H6 is maintained at a concentration between 1-20%. In yet another embodiment, the Si2H6 is at or below about 10%. The silicon dopant gas composition 103 inside the source chamber 112 is subject to ionization by applying a predetermined voltage from a power supply source (not shown) to resistively heat a tungsten-based filament 114 positioned in close proximity to the IHC 115. The filament 114 may be negatively biased relative to the IHC 115. A current is applied to the filament 114 through the power supply source to resistively heat the filament 114. An insulator 118 is provided to electrically isolate the cathode 115 from the arc chamber wall 111.

Electrons are emitted by the cathode 115. The emitted electrons accelerate and ionize the SiF4 and Si2H6 of the silicon dopant composition 103 molecules to produce a plasma environment within the chamber 112. The repeller electrode 116 builds up a negative charge to repel the electrons back to sustain ionization of silicon dopant composition 103 molecules, thereby maintaining the plasma environment in the arc chamber 112. Repeller electrodes 116 are preferably configured substantially diametrically opposed to the IHC 115 to maintain ionization of the dopant gas composition 103 within the chamber 112. The arc chamber wall 111 includes an extraction aperture 117 through which a well defined silicon ion beam 121 is extracted from out of the arc chamber 112. The extraction system includes extraction electrode 120 and suppression electrode 119 positioned in front of the extraction aperture 117. Both the extraction and suppression electrodes 120 and 119 have respective apertures aligned with the extraction aperture 117 for extraction of the well-defined ion beam 121 that can be used for silicon ion implantation.

Ionization of the silicon-based dopant gas composition 103 may cause generation of a variety of ionized species from a synergistic interaction of the SiF4 with Si2H6, including F ions, silicon-fluoride ions and various silicon-containing ions to be released from co-species SiF4, and hydrogen, silicon-hydride and additional silicon-containing ions to be released from co-species Si2H6. A large amount of the released F ions are available for scavenging by hydrogen. Additionally, the released F ions can recombine with some of the gaseous silicon ions formed from ionization of the dopant gas mixture. However, under sufficient operating conditions, including selection of an arc voltage that favorably allows synergistic interaction of Si2H6 with SiF4 within ion source apparatus 100 by virtue of their corresponding ionization cross-sections at the selected operating arc voltage (FIG. 4) and by controlling the relative amounts of SiF4 and Si2H6 introduced into the ion chamber in accordance with principles of the present invention, the amount of silicon ions which recombine with F ions is substantially minimized so as to generate a maximal concentration level of active silicon ion available for ion implantation that increases beam current. As a result, the manner in which F ions are scavenged makes available less F ions to etch W-based chamber components from ion source apparatus 100 and form W-containing deposits, while maintaining a sufficient amount of active silicon ions for implantation. Reducing the formation of W-containing deposits translates into less diffusion and decomposition of W-containing deposits onto the hotter surfaces of IHC 115. Accordingly, the rate of weight gain of the IHC 115 during operation of the ion source apparatus 100 is substantially reduced. The end result is a lower frequency or elimination of beam glitching, thereby increasing beam stability and extending the operational lifetime of the ion source apparatus 100.

The scavenging of the F ions by virtue of the interaction of the SiF4 and Si2H6 co-species can help, at least in part, create an enhanced ionization mechanism which generates increased amounts of active silicon ions that are greater than the simple additive effect of total Si ions that would be available by individually ionizing SiF4 and Si2H6. Furthermore, the SiF4 and Si2H6 co-species in combination may be interacting in a favorable manner as explained in terms of their ionization cross-sections that improves their respective ionization characteristics. While the specific ionization mechanism is not fully understood, the overall effect of the release of silicon ions is a synergism that yields an improved and sustained beam current which does not incur momentary drops in current, as typically observed by silicon dopant gases used with or without a diluent gas. The active concentration of silicon ions available for ion implantation is maintained at sufficient levels at least in part because the present invention utilizes two silicon co-species in a specific ratio from which silicon ions are derived. Further, accumulation of deposits are avoided or substantially minimized, thereby eliminating the need for incorporating a diluents or inert gas. The improved and sustained beam current of the present invention translates into higher throughput and productivity, in which required silicon ion dosage implanted into the substrate can be achieved in a shorter time period.

In this manner, unlike the prior art, the present invention utilizes a dual purpose silicon dopant gas composition, such as SiF4 and Si2H6 in a preferred concentration, and under carefully selected ionization conditions and energy inputted into the tungsten-based filament 114 which can increase silicon beam current without compromising ion source life. The SiF4 and Si2H6 interact with one another in a synergistic manner to create an ionization mechanism that generates an increased amount of Si+ ions at least in part by virtue of the higher ionization cross-section complementary gas species Si2H6 exhibits over SiF4 within the selected operating range of 80V-120V and furthermore because the concentration of Si2H6 is maintained below a predetermined upper limit of 50% or less.

Figure 2:
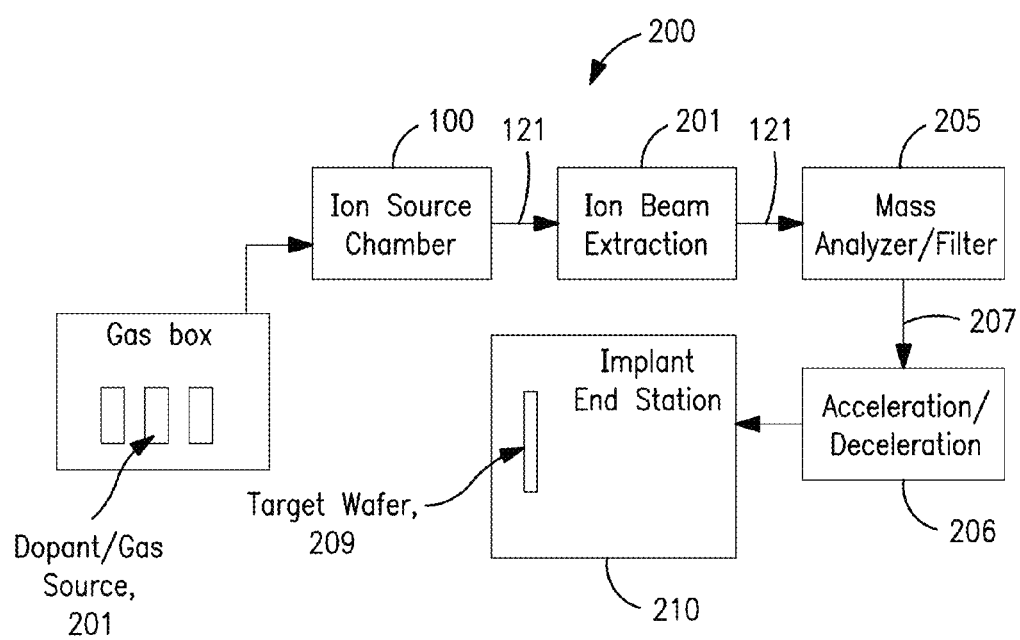
FIG. 2 shows the ion implanter of FIG. 1 within a silicon implant system.

FIG. 2 shows the ion source apparatus 100 of FIG. 1 incorporated into a silicon ion implant system 200. It should be appreciated by one skilled in the art that that all of the elements of the ion source apparatus 100 of FIG. 1 are incorporated into FIG. 2. As a result, the elements and features of the ion source apparatus 100 shown in FIG. 2 should be understood in relation to the elements and features shown in FIG. 1.

FIG. 2 shows that the silicon-based dopant gas composition can be supplied form a dopant gas box 201. The silicon-based dopant gas composition can be provided as a pre-mixed composition in a single supply vessel within gas box 201 at the desired formulation. Alternatively, the gas box 201 may be constructed and arranged such that each of the silicon co-species, SiF4 and Si2H6, can be supplied in separate dispensing vessels as part of a gas kit which are then co-flowed or sequentially flowed, continuously or semi-continuously, at controlled flow rates utilizing corresponding flow controllers which may be considered part of the gas kit. The flow rates of Si2H6 and SiF4 are controlled and directed towards the ion source apparatus 100 to create the desired silicon-based dopant gas composition at the preferred concentration ranges. Such dopant gas composition can produced at either the inlet to the source chamber 100 and/or therewithin. The point at which the individual co-species converge can occur upstream of the ion source apparatus 100 or within the chamber 112 of the apparatus 100.

Still referring to FIG. 2, a suitable analyzer as commercially available and known in the art can be used to measure the concentration of the silicon-based dopant gas composition entering the ion source chamber 100. In one embodiment, the silicon dopant gas composition has a concentration that ranges between about 1-20 vol % Si2H6 with the balance SiF4. In a preferred embodiment, the silicon dopant gas composition has a concentration that ranges between about 2-10 vol % Si2H6 with the balance SiF4. In a more preferred embodiment, the silicon dopant gas composition has a concentration that ranges between about 2-5 vol % Si2H6 with the balance SiF4.

Still referring to FIG. 2, the silicon-based dopant gas composition is introduced from box 201 into the ion source apparatus 100 as a pre-mixed single source or as individual species of SiF4 and Si2H6 in the manner immediately described above in either a co-flowed or sequentially flowed manner into the apparatus 100. A voltage is applied to ion source filament 114 as a means for introducing energy into the chamber 112 (FIG. 1) to generate the selected arc voltage of apparatus 100 to ionize the silicon-based dopant gas composition and produce a sufficient concentration of active silicon ions available for implantation. Preferably, the energy inputted to the ion source 114 (i.e., arc voltage) is maintained in a range of about 80V-120V so as to enable interaction of SiF4 and Si2H6 in a synergistic manner to create an ionization mechanism that generates an increased amount of active Si+ ions. A resultant plasma environment within the chamber 112 is produced. The ion beam extraction system 201 includes extraction electrode 120 and suppression electrode 119 that form part of the silicon-containing dopant supply system as shown in FIG. 2 and which are configured for extraction of a well-defined silicon beam 121 to be used for silicon ion implantation. The beam 121 may be transported through an optional mass analyzer/filter 205 to select and magnetically capture the silicon ion species from other species to be implanted. Specifically, the mass analyzer/filter 205 is arranged to permit only the targeted active silicon ions to travel onwards into the process chamber or end station 210. The silicon-rich ion beam 207 can then be accelerated/decelerated by acceleration/deceleration unit 206 as required and then transported to the surface of a wafer or target workpiece 209 positioned in an end station 210 for implantation of the active silicon ions into the workpiece 209. The active silicon ions of the beam collide with and penetrate into the surface of the workpiece 209 at the desired depth to form a region with the desired electrical and physical properties. By employing the process and techniques of this invention, the beam current of the ion source apparatus 100 included within system 200 can be significantly increased over conventional silicon dopant systems without incurring a drop in ion source life. As such, the present invention represents an advancement in the silicon ion implantation industry which, among other process benefits, increases throughput of the ion source apparatus 100.

It should be noted many variations in the structure and design of the silicon implant process 200 may be employed in different embodiments of the present invention. Furthermore, the details of the construction and design are not important in the performance of the present invention, except insofar as they relate to the silicon-based dopant composition used in the ion source apparatus 100 and corresponding implant process 200.

In a preferred aspect of the invention shown in FIG. 2, a controlled flow of the silicon-based dopant gas composition comprising Si2H6 and SiF4 is supplied pre-mixed to the ion source chamber 112 of the ion source apparatus 100 in which the concentration of the Si2H6 ranges from about 1-10 vol % based on the overall mixture. The silicon-based dopant gas composition can be packaged pre-mixed in a high pressure cylinder. Alternatively, the dopant gas composition may be delivered from a sub-atmospheric delivery package such as, by way of example, an UpTime® sub-atmospheric delivery system as disclosed in U.S. Pat. Nos. 5,937,895; 6,045,115; 6,007,609; 7,708,028; and 7,905,247, all of which are incorporated herein by reference in their entirety. Other suitable sub-atmospheric delivery devices may include pressure regulators, check valves, excess flow valves and restrictive flow orifices in various arrangements. For example, two pressure regulators may be disposed in series within the cylinder to down regulate the cylinder pressure of the dopant gas to a predetermined pressure acceptable for downstream mass flow controllers contained along the fluid discharge line. A sub-atmospheric package is a preferred mode for delivery of the gas due to its enhanced safety. In one embodiment, the flow rate of can range from about 0.1-100 sccm, preferably 0.5-50 sccm and more preferably from about 1-10 sccm. The ion source apparatus 100 can include any of the commonly used ion sources in commercial ion implanters, such as Freeman and Bernas type sources, indirectly heated cathode sources and RF plasma sources. The ion source operating parameters including pressure, filament current and arc voltage, are tuned to achieve desired ionization of the silicon-based dopant gas composition comprising $Si_2H_6$ and $SiF_4$ such that under the selected parameters, the $Si_2H_6$ possesses a higher ionization cross-section compared to $SiF_4$ thereby enhancing ionization and generation of active Si ions in accordance with principles of the present invention.

In another embodiment of the present invention, the Si-containing dopant composition is a mixture of $SiF_4$ and $Si_2H_6$ at the prescribed concentrations discussed above that may be operated at a lower arc voltage for suitable ion implant applications. The lower voltage may reduce the attack on chamber components. In particular, operating at a lower arc voltage results in less chemical as well as physical erosion of the components, thereby extending the lifetime of the ion-source. Operating at a lower arc voltage preferably results in substantial maintenance of beam current. Advantageously, the reduction in arc voltage does not result in accumulation of deposits and beam instability, as is the case with a beam generated solely from undiluted $SiF_4$ in which accumulation of W-containing deposits on the filament reduces the electron emission efficiency of the ion source, which can potentially result in a loss of beam current due to insufficient ionization of the source gas.

Applicants have performed several experiments to compare the silicon-based dopant gas compositions of the present invention with other dopant gas materials, as will now be discussed in the Examples below. It should be noted that for all tests described below, the ion source filament weight gain or loss was measured by taking weight measurements of the ion source filament before and after the test as known in the art. The current was measured using a Faraday cup by standardized techniques well known in the art. All tests were run at 100V.

COMPARATIVE EXAMPLE 1

Undiluted $SiF_4$

An ionization test was performed to evaluate ion beam performance of an ion beam derived from a dopant gas composition of $SiF_4$ only (i.e., undiluted). The interior of the chamber consisted of an ion source that was constructed to include a helical filament and anode situated perpendicular to an axis of the helical filament. A substrate plate was positioned in front of the anode to keep the anode stationary during the ionization process. The $SiF_4$ was introduced into the ion source chamber. Voltage was applied to the ion source to ionize the $SiF_4$ and produce silicon ions. The beam current that was measured is shown in FIG. 3. The beam current was considered acceptable for purposes of generating a well-defined silicon ion beam that could be used for ion implantation. However, a significant filament weight gain of 0.02 gm/hr was observed and determined as shown in Table 1. The accumulation of various W-containing deposits on the filament during the test reduced its electron emission efficiency resulting in eventual loss of beam current due to insufficient ionization of the source gas, which required the test to be aborted. These results were believed to be typical of problems encountered with utilizing solely $SiF_4$ as the Si+ dopant source.

COMPARATIVE EXAMPLE 2

$SiF_4$+20% Xe/$H_2$

An ionization test was performed to evaluate the ion beam current obtained from a silicon-based dopant gas composition composed of a mixture of $SiF_4$ and a diluent gas mixture of xenon/hydrogen at 20 vol % of the total gas mix, along with the performance of the ion-source during the course of ionization for a certain duration. The same ion source chamber was utilized as when performing the baseline $SiF_4$ test in Comparative Example 1. The $SiF_4$ and diluent xenon/hydrogen were introduced from separate sources into the ion source chamber to produce the desired dopant gas composition within the chamber. Voltage was applied to the ion source to ionize the $SiF_4$ and produce silicon ions. Beam current was measured and determined to be about 10% lower than that produced with utilizing only $SiF_4$, as shown in FIG. 3 at Case B. Beam current was normalized against that of $SiF_4$ from Comparative Example 1 and is shown in FIG. 3. A weight gain of 0.0017 gm/hr of the filament was obtained as shown in Table 1. Weight gain of the filament due to deposits was less than that of $SiF_4$ from Comparative Example 1, indicating less active F ions were available to sustain the halogen cycle and therefore etch additional tungsten chamber components. As a result, the halogen cycle was reduced relative to that of Comparative Example 1. Less beam glitching occurred relative to Comparative Example 1. However, the xenon/hydrogen diluent reduced the halogen cycle and W-containing deposits at the expense of generating a beam current lower than that of utilizing solely $SiF_4$ (FIG. 3). These results were indicative of conventional silicon dopant gas precursors that use a diluent gas.

COMPARATIVE EXAMPLE 3

50% $SiF_4$+50% $SiH_4$

An ionization test was performed to evaluate the ion beam current obtained from a silicon-based dopant gas composition composed of a mixture of $SiF_4$ and $SiH_4$, along with the performance of the ion-source during the course of ionization for a certain duration. The concentration of the mix was 50 vol % $SiF_4$ and 50 vol % $SiH_4$. The same ion source chamber was utilized as when performing the tests in Comparative Examples 1 and 2. The $SiF_4$ and $SiH_4$ mixture was introduced from separate sources into the ion source chamber to produce the desired dopant gas composition within the chamber. A concentration measurement was obtained to confirm the target concentration was achieved. Voltage was applied to the ion source to ionize the dopant gas mixture and produce silicon ions. Beam current was measured and normalized against that of $SiF_4$, as shown in FIG. 3 at Case C. The beam current was determined to be higher than that produced when utilizing the $SiF_4$ and diluent xenon/hydrogen mixture of Comparative Example 2, but lower than that produced when utilizing only $SiF_4$ of Comparative Example 1. The results may be explained, at least in part, by reference to FIG. 4, which shows that $SiH_4$ has a lower ionization constant than that of $SiF_4$ at virtually all operating energy levels inputted to the ion source. As such, less active silicon ions derived from collision of $SiH_4$ and $SiF_4$ were generated. Because $SiH_4$ has a smaller ionization cross-section than $SiF_4$, there may been a reduction in the net probability of $SiF_4$ to undergo collision and ionize, thereby resulting in an overall drop of silicon ion beam current. A weight loss of 0.0025 gm/hr of the filament was obtained as shown in Table 1. Thinning of the filament was observed as a result of possible physical sputtering of the filament by corresponding positive ionic species of $SiF_4$ and $SiH_4$ within the ion chamber. It was therefore concluded that a 50% SiF4 and 50% vol % SiH4 dopant gas mixture could result in premature failure due to excessive ion source filament thinning.

COMPARATIVE EXAMPLE 4

SiF4+50% Si2H6

Figure 5:
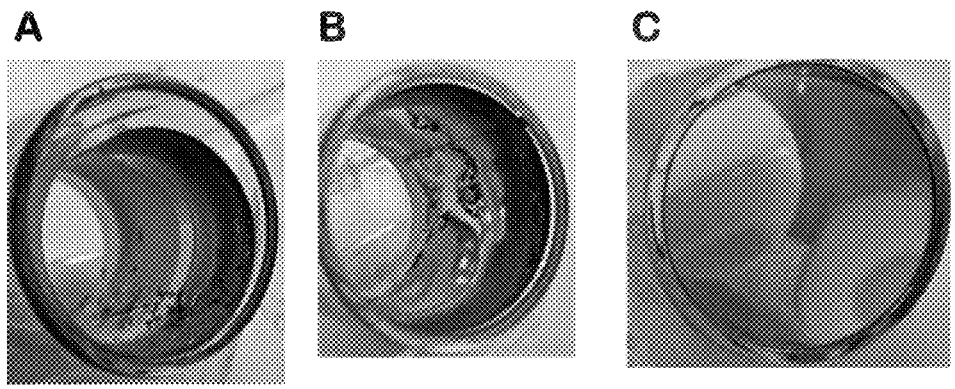
FIG. 5 shows arc chamber deposits after operation with different silicon-containing dopant compositions.

An ionization test was performed to evaluate the ion beam current obtained from a silicon-based dopant gas composition composed of SiF4 and 50 vol % Si2H6, along with the performance of the ion-source during the course of ionization for a certain duration. The same ion source chamber was utilized as when performing the tests in Comparative Examples 1, 2, 3. The silicon-based dopant gas composition was introduced into the chamber via separate SiF4 and Si2H6 sources and mixed in the flow lines upstream of the ion source chamber. A concentration measurement was obtained to confirm the target concentration was achieved. Voltage was applied to the ion source to ionize the dopant gas composition and produce silicon ions. Beam current was measured and normalized against that of SiF4. FIG. 3 at Case F shows that the beam current obtained was about 10% lower than SiF4 (Comparative Example 1). The filament lost weight at a rate of 0.0023 gm/hr. Significant Si containing deposits were observed along surfaces of the ion source arc chamber after continued operation for 20 hrs, as shown in FIG. 5B. Such accumulation of deposits resulted in beam instability during the course of operation and eventual pre-mature failure of the ion source. Hence, it was concluded that this gas composition was undesirable for Si implant operation.

COMPARATIVE EXAMPLE 5

SiF4+80% Si2H6

An ionization test was performed to evaluate the ion beam current obtained from a silicon-based dopant gas composition composed of SiF4 and 80 vol % Si2H6, along with the performance of the ion-source during the course of ionization for a certain duration. The silicon-based dopant gas composition was introduced into the chamber via separate SiF4 and Si2H6 sources and mixed in the flow lines upstream of the ion source chamber. The same ion source chamber was utilized as when performing the tests in Comparative Examples 1, 2, 3 and 4. The pre-mixed silicon-based dopant gas composition was introduced into the chamber. A concentration measurement was obtained to confirm the target concentration was attained. Voltage was applied to the ion source to ionize the dopant gas composition and produce silicon ions. Beam current was measured and normalized against that of SiF4. The mixture of 80% Si2H6 balance SiF4 exhibited a significantly lower measured Si+ beam current compared to the undiluted SiF4 baseline case of Comparative Example 1. FIG. 3 at Case G shows that the beam current was more than 60% lower than SiF4 (Comparative Example 1). Furthermore, the ion beam exhibited instability during the course of operation and eventually resulted in pre-mature failure of the ion source. The filament lost weight at a rate of –0.0025 gm/hr as shown below in Table 1. FIG. 5A shows that undesirable amounts of Si-containing deposits along surfaces of the arc chamber were observed after continued operation for 20 hrs. Hence, it was concluded that this Si-containing dopant gas composition was undesirable for Si ion implant operation.

EXAMPLE 1

SiF4+2.5 vol % Si2H6

An ionization test was performed to evaluate the ion beam current obtained from a silicon-based dopant gas composition composed of SiF4 and 2.5 vol % Si2H6, along with the performance of the ion-source during the course of ionization for a certain duration. The same ion source chamber was utilized as when performing the tests in Comparative Examples 1, 2, 3, 4 and 5. The silicon-based dopant gas composition was produced by co-flowing into the chamber a 5% Si2H6/SiF4 mix and a pure SiF4 stream at selected flow rates such that the pure SiF4 stream diluted the 5% Si2H6/SiF4 mix to produce 2.5 vol % Si2H6. A concentration measurement was taken to confirm the target 2.5 vol % Si2H6 was produced. Voltage was applied to the ion source to ionize the silicon-based dopant gas composition and produce silicon ions. Beam current was measured and normalized against that of SiF4. Beam current as shown in FIG. 3 at Case E was determined to be higher than that produced when utilizing the SiF4. A weight loss of –0.0009 gm/hr of the filament was obtained as shown in Table 1. The silicon-based dopant composition produced the least amount of weight change of the filament of all tests. Furthermore, FIG. 5C shows virtually no deposits were observed along the surfaces of the arc chamber. It was therefore concluded that the SiF4 and 2.5 vol % Si2H6 dopant gas composition can produce higher beam currents than SiF4 while significantly reducing W-based deposits on the source filament as well as avoiding physical sputtering of the filament.

EXAMPLE 2

SiF4+5 vol % Si2H6

An ionization test was performed to evaluate the ion beam current obtained from a silicon-based dopant gas composition composed of SiF4 and 5 vol % Si2H6, along with the performance of the ion-source during the course of ionization for a certain duration. The same ion source chamber was utilized as when performing the tests in Comparative Examples 1, 2, 3 and Example 1. The silicon-based dopant gas composition was introduced from separate sources and pre-mixed upstream of the chamber. A concentration measurement was taken to confirm the target 5 vol % Si2H6 was produced. Voltage was applied to the ion source to ionize the dopant gas composition and produce silicon ions. Beam current was measured and normalized against that of SiF4. Beam current as shown in FIG. 3 at Case D was determined to be highest amongst all tested dopant gas compositions. No premature beam glitching occurred as a result of filament weight gain or erosion. A weight loss of –0.0012 gm/hr of the filament was obtained as shown in Table 1. The weight change of the filament was less than that of all of the Comparative Examples 1-3 and comparable to that of Example 1. No deposits were observed during the test. Although the weight decrease was slightly more than that of SiF4+2.5 vol % Si2H6 in Example 1, the weight decrease did not produce beam instability. It was therefore concluded that the SiF4 and 5 vol % Si2H6 dopant gas composition could produce higher beam currents than that utilizing solely SiF4 while significantly reducing W-based deposits and physical sputtering on the source filament.

TABLE 1

Source life evaluation

| Dopant Gas Composition | Filament weight gain/loss rate | Si containing deposits in arc chamber |
| --- | --- | --- |
| $SiF_4$ only | +0.02 gm/hr | No |
| $SiF_4$ + $Xe/H_2$ | +0.0017 gm/hr | No |
| $SiF_4$ + $SiH_4$ | −0.0025 gm/hr | No |
| $SiF_4$ + $Si_2H_6$ (2.5%) | −0.0009 gm/hr | No |
| $SiF_4$ + $Si_2H_6$ (5%) | −0.0012 gm/hr | No |
| SiF4 + Si2H6 (50%) | −0.0023 gm/hr | Yes |
| SiF4 + Si2H6 (80%) | −0.0025 gm/hr | Yes |

The Examples demonstrate that an upper limit exists on the Si2H6 concentration in a mixture of Si2H6-SiF4 to realize the benefits of a dopant gas composition disclosed in the present invention. FIGS. 5A-5C show the interior of an arc chamber after continuous operation with different concentrations of Si2H6 in a mixture of SiF4 and Si2H6. The composition with 80% and 50% Si2H6, respectively, each exhibited undesirable amounts of deposits in the arc chamber after continued operation for 20 hrs whereas no deposits were observed for 2.5% Si2H6-SiF4 mix even after 60 hours of continued operation. Additionally, it was discovered that at higher Si2H6 compositions of 50% and 80%, the ionization process results in Si and/or W containing deposits inside the arc chamber. Such deposits are undesirable and lower the active Si ions which leads to a reduction in Si+ beam current during the course of operation. As a result, subsequent premature failure of the ion source can occur. These observations place an upper limit on the preferred composition for a Si2H6-SiF4 mix to realize the benefits of improved beam current characterized by increased beam current without ion source degradation during operation.

The invention further demonstrates that the etching of W-containing and other various types deposits from chamber wall components is significantly reduced when using the silicon-based dopant gas composition of the present invention. Reduction of deposits reduces or eliminates beam instability and eventual beam glitching, thereby improving the beam current during source life of the ion chamber. Furthermore, unlike prior art methods, the compositions, systems and methods of use for this invention can increase the beam current without compromising and shortening the ion source life. Surprisingly, as shown in FIG. 3, increased beam current can be achieved compared to undiluted $SiF_4$. The ability to increase the number of Si dopant active ions per unit volume of gas flow as compared to undiluted or pure SiF4 increases the Si beam current for the same amount of gas flow without degradation of the ion source. Increased beam current coupled with extended ion source can increase throughput and provides an opportunity for reducing cycle time to achieve the required dopant dosage of the process workpieces.

From an ionization standpoint, Examples 1 and 2 also demonstrate that specific silicon-containing compositions of the present invention can generate active ions and an increased beam current without degradation of the ion source. In particular, a Si2H6 and SiF4 mixture within preferred concentration ranges at selected arc voltage operating conditions facilitate interaction with one another in a synergistic manner to create an ionization mechanism which can generate an increased amount of active silicon ions that is greater than the simple additive effect of total silicon ions that would be available from individually ionizing SF4 and Si2H6. The net effect is an improvement in beam current in comparison to conventional systems and processes employing conventional silicon precursor materials.

Additionally, the present invention can overcome the drawbacks of conventional silicon ion implant systems and methods which require a diluent gas for the purpose of reducing deposits. Diluent gases tend to reduce the active number of silicon ions available per unit gas flow into the ion source chamber, thereby reducing throughput. Accordingly, this so-called "dilution effect" typically encountered with conventional silicon dopant compositions employing a dopant gas with diluent gas resulting in lower silicon ion beam current is eliminated in the present invention. The present invention does not rely on incorporation of a diluent gas for purposes of extending source life. However, the present invention does contemplate in specific instances the incorporation of a diluent or inert gas as a second species in a specific manner whereby it has a higher ionization cross section than a first silicon-containing species. In this manner, the present invention possesses a unique silicon-based dopant gas composition, system and method of use thereof capable of maintaining or increasing silicon ion beam current while simultaneously maintaining the integrity of the source filament 115 for a longer duration than previously possible utilizing conventional silicon precursor materials.

The present invention also offers other process benefits. For example, the increased beam current attainable in the present invention can eliminate the requirement of any additional gas stick (e.g., flow control device, pressure monitoring device, valves and electronic interface), and therefore offers a significant reduction in capital expense associated with utilizing additional gas sticks.

While it has been shown and described what is considered to be certain embodiments of the invention, it will, of course, be understood that various modifications and changes in form or detail can readily be made without departing from the spirit and scope of the invention. It is, therefore, intended that this invention not be limited to the exact form and detail herein shown and described, nor to anything less than the whole of the invention herein disclosed and hereinafter claimed.

The invention claimed is:

1. A dopant gas composition comprising:
   a silicon-based dopant gas composition comprising a first silicon-based species and a second species, wherein said second species is selected to have a ionization cross-section higher than that of the first silicon-based species at an operating arc voltage of an ion source utilized during generation and implantation of active silicon ions;
   wherein said silicon-based dopant gas composition improves the ion beam current so as to maintain or increase beam current without degradation of said ion source in comparison to a beam current generated from silicon tetrafluoride (SiF4).

2. The dopant gas composition of claim 1, wherein said first silicon-based species is selected from the group consisting of SiH2Cl2, Si2H6, SiH4 SiF2H2, SiF4 and any combination thereof.

3. The dopant composition of claim 1, wherein said first silicon-based species is SiF4.

4. The dopant composition of claim 1, wherein said first silicon-based species is SiF4 and the second species is disilane (S2H6).

5. The dopant composition of claim 4, wherein said S2H6 has a concentration of less than 50% based on the overall volume of said composition.

6. The dopant composition of claim 5, wherein said S2H6 has a concentration of about 10% or less.

7. A system for providing an improved beam current during silicon ion implantation, comprising:
an ion source apparatus partially defined by an arc chamber wall, wherein the chamber comprises a silicon ion source disposed at least partially within the chamber wall;
one or more supply vessels in fluid communication with said ion source apparatus, said vessels storing a silicon-based dopant gas composition, said composition comprising a first silicon-based species and a second species, wherein said second species is selected to have an ionization cross-section higher than that of the first silicon-based species at an operating arc voltage of the ion source during implantation of active silicon ions;
one or more supply feed lines corresponding to the one or more supply vessels, said feed lines extending from the one or more supply vessels through the wall into the chamber;
wherein said one or more vessels are configured to dispense said silicon-based dopant composition through said supply feed lines and into said ion source apparatus thereby allowing the silicon ion source to ionize the silicon-based dopant gas composition to generate at least a portion of the active silicon ions from at least said first silicon-based species, the active silicon ions producing an increased beam current in comparison to a beam current generated solely from SiF4.

8. The system of claim 7, wherein said first silicon-based species is selected from the group consisting of SiH2Cl2, Si2H6, SiH4 SiF2H2, SiF4 and any combination thereof.

9. The system of claim 7 wherein said first silicon-based species is SiF4 and said second species is a silicon-based species, said silicon-based species comprising Si2H6.

10. The system of claim 9, wherein said Si2H6 is at a concentration of 1-10 vol % based on the overall silicon-based dopant composition.

11. The system of claim 7, wherein a first supply vessel and a second supply vessel are provided as part of a gas kit, said first supply vessel comprising SiF4 and said second supply vessel comprising Si2H6, each of said first and second supply vessel dispensing SiF4 and Si2H6, respectively, to the ion source chamber at controlled flow rates to produce a silicon-containing dopant composition within the chamber comprising SiF4 and Si2H6 at a predetermined concentration whereby the concentration of Si2H6 is less than about 20 vol %.

12. The system of claim 11, wherein said kit comprises a first flow controller for regulating flow of SiF4 at a first flow rate from a first supply vessel, and said kit further comprises a second flow controller for regulating flow of Si2H6 at a second flow rate from a second supply vessel.

13. The system of claim 7, wherein a single supply vessel is pre-mixed with the silicon-based dopant gas composition, further wherein said supply vessel is a sub-atmospheric storage and delivery vessel.

14. The system of claim 9, wherein the S2H6 is in an amount of between 2.5 vol % to 5 vol % based on the overall volume of said composition.

15. A method for increasing beam current during silicon ion implantation, comprising:
selecting a first silicon-based species;
selecting a second species having an ionization cross-section higher than that of the first silicon-based species at a predetermined operating arc voltage of an ion source to be utilized during generation and implantation of active silicon ions;
providing the first silicon-based and the second species in one or more supply vessels;
flowing the first silicon-based species and the second species from the one or more supply vessels into an ion source apparatus;
ionizing the first silicon-based species;
generating active silicon ions; and
producing an increased beam current in comparison to a beam current generated solely from SiF4, wherein said increased beam current extends source life in comparison to a beam current generated solely from SiF4.

16. The method of claim 15, wherein said second species is a silicon-containing species, said first and second silicon-containing species selected from the group consisting of SiH2Cl2, Si2H6, SiH4 SiF2H2, SiF4 and any combination thereof.

17. The method of claim 15, wherein said first silicon-based species is SiF4 and the second species is a silicon-based species comprising Si2H6 ranging between about 2.5 vol % to about 5 vol % based on the overall composition in the ion source apparatus.

18. The method of claim 15, wherein a first supply vessel and a second supply vessel are provided as part of a gas kit, said first supply vessel comprising SiF4 and said second supply vessel comprising Si2H6, each of said first and second supply vessel dispensing SiF4 and Si2H6, respectively, to the ion source chamber at controlled flow rates in a co-flowed or sequentially flowed manner to produce a silicon-containing dopant composition within the chamber comprising SiF4 and Si2H6 at a predetermined concentration whereby the concentration of Si2H6 is greater than about 1 vol % and less than about 10 vol % based on a volume of the overall composition.

19. The method of claim 15, wherein said predetermined operating arc voltage ranges from about 80 V-120 V.

20. The method of claim 15, wherein a single supply vessel dispenses a concentration comprising about 10 vol % or lower of Si2H6 and the balance SiF4.

\* \* \* \* \*